United States Patent [19]
Mokuo et al.

[11] Patent Number: 5,911,232
[45] Date of Patent: Jun. 15, 1999

[54] ULTRASONIC CLEANING DEVICE

[75] Inventors: Shori Mokuo, Kiyama-cho; Keiji Taguchi, Kurume; Shigenori Kitahara, Chikugo, all of Japan

[73] Assignee: Tokyo Electron, Ltd., Tokyo-to, Japan

[21] Appl. No.: 08/921,328

[22] Filed: Aug. 29, 1997

[30] Foreign Application Priority Data

Sep. 4, 1996 [JP] Japan ................................. 8-253923
Jun. 4, 1997 [JP] Japan ................................. 9-161878

[51] Int. Cl.$^6$ ........................................................ B08B 3/12
[52] U.S. Cl. ............................. 134/184; 134/1.3; 310/317
[58] Field of Search .................................... 134/184, 186, 134/1, 1.3, 902; 68/355; 366/114, 115, 127; 310/317

[56] References Cited

U.S. PATENT DOCUMENTS 2,891,176  6/1959  Branson ................................. 134/1 X

FOREIGN PATENT DOCUMENTS 5-243203  9/1993  Japan .
2097890  11/1982  United Kingdom ..................... 134/1

*Primary Examiner*—Philip R. Coe
*Attorney, Agent, or Firm*—Smith, Gambrell & Russell; Beveridge, DeGrandi, Weilacher & Young Intellectual Property Group

[57] ABSTRACT

Disclosed is an ultrasonic cleaning device including a cleaning tank containing a semiconductor wafer W and pure water, and a plurality of vibrating plates provided with the cleaning tank. The vibrating plates are electric distortion transducers. By controlling the output phases of oscillators that vibrate the plates with a single oscillating source, the output phases of the oscillation sources can be matched. This enables uniform sound pressure distribution. Consequently, ultrasonic interference between vibrating plates can be eliminated. Uniform sound pressure distribution makes it possible to obtain a uniform particle removal rate, thereby improving cleaning efficiency.

8 Claims, 15 Drawing Sheets

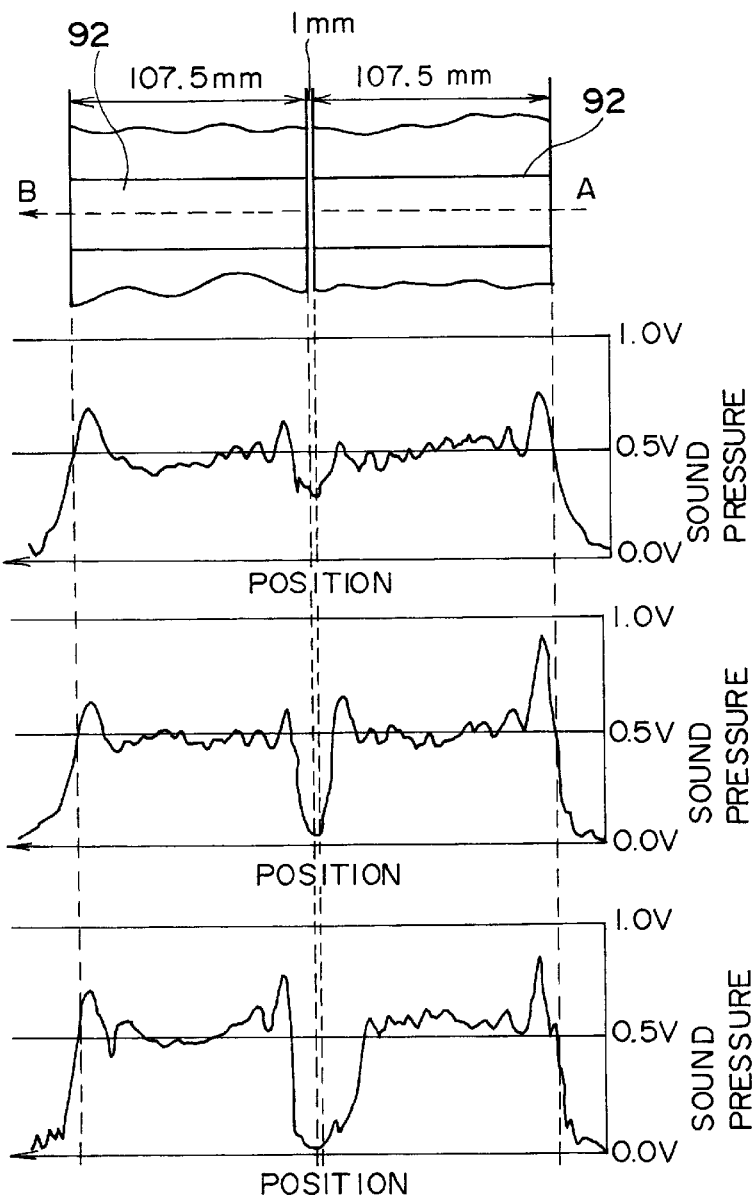

ULTRASONIC CLEANING DEVICE

BACKGROUND OF THE INVENTION

1. Field of the Invention

The present invention relates to an ultrasonic cleaning device for ultrasonically cleaning an object such as, for instance, a semiconductor wafer or an LCD glass plate.

2. Description of the Related Arts

A liquid processing method in which semiconductor wafers or LCD glass plates or the like are cleaned by being sequentially immersed in a processing tank containing a processing liquid such as treating liquid or rinsing liquid (cleaning liquid) is generally used in the manufacturing process of semiconductor manufacturing equipment.

An ultrasonic cleaning device is known which is shown in FIG. 16 and in which a plurality of vibrating plates (transducers) 3 are affixed using an adhesive to, for instance, the bottom of a cleaning tank 2 containing objects to be cleaned, for instance semiconductor wafers W (hereinafter wafers W), and cleaning liquid, for instance pure water 1. In this ultrasonic cleaning device, a high frequency voltage of, for instance, 200 KHz to 1 MHz generated by an oscillation source 4 is applied to each vibrating plate 3, thereby exciting the vibrating plates 3 and enabling particles deposited on the wafers W to be removed. The relation between particle removal rate (A) and sound pressure (B) is:

A T×B2 (T is a proportionality constant)

As the above equation demonstrates, the relationship between the excitement of the vibrating plates 3, namely sound pressure, and the particle removal rate is proportional, and therefore particles and the like deposited on wafers W can be removed by exciting the vibrating plates 3 and increasing sound pressure.

However, in a conventional cleaning device of this type, the vibrating plates 3 have to be separated for insulation because they are driven by oscillators 4 having independent oscillation sources, respectively. As a result, ultrasonic interference occurs in the gap created between the vibrating plates 3, producing unevenness in the sound pressure as shown in FIG. 17a. Consequently, there has been the problem that the particle removal rate has been uneven as shown in FIG. 17b, causing inconsistency in the cleaning.

As a means of solving this problem, an ultrasonic cleaning device has been proposed wherein a level difference is provided on the installation surfaces and the vibrating plates are installed on both sides of this level difference (See: Japanese Patent Laid-Open No. Hei 5-243203). However, even in the technology disclosed in Japanese Patent Laid-Open No. Hei 5-243203, the level difference between adjacent vibrating plates creates a gap which causes ultrasonic interference. This creates the problems that uniform sound pressure cannot be obtained and particles cannot be uniformly removed, causing inconsistencies in cleaning. There is an additional problem that, installing the vibrating plates with a level difference between installation surfaces requires precision during assembly and increases the complexity and scale of the device increases.

SUMMARY OF THE INVENTION

The present invention has been devised after consideration of the above-mentioned problems and aims to provide an ultrasonic cleaning device for improving cleaning efficiency by eliminating ultrasonic interference between adjacent vibrating plates and obtaining a uniform particle removal rate by means of uniform sound pressure distribution.

In order to achieve the above objectives, the ultrasonic cleaning device of the present invention comprises a cleaning tank containing an object to be cleaned and cleaning liquid, a plurality of vibrating plates which act upon the cleaning tank, a plurality of power units for applying high frequency voltages to the vibrating plates, and a single oscillation source for controlling phases of drive outputs of the plurality of power sources.

The single oscillation source may be formed from one of the power units and one oscillator, or it may be provided independently from the plurality of power units.

Moreover, the vibrating plates may be split into a plurality of groups with a power unit provided to each group, and the drive output phases of all power units may be controlled by a single oscillation source.

Furthermore, a vibration propagation tank may be provided for containing the cleaning tank in vibration propagation fluid and vibrating plates may be installed to the vibration propagation tank.

The vibrating plates can be arranged without substantial gaps therebetween. Furthermore, the frequency of the oscillation source can be modulated.

By using a single power source to phase-control the output of the oscillation source for each vibrating plate, the ultrasonic cleaning device of the present invention is able to obtain uniform sound pressure distribution and a uniform particle removal rate.

Furthermore, uniform sound pressure distribution and a uniform particle removal rate can be even more reliably obtained due to the practical elimination of gaps between adjacent vibrating plates.

Moreover, since vibrating plates can be installed to the cleaning tank without providing gaps therebetween, device assembly can be simplified. Also, controlling the plurality of vibrating plates with a single oscillation source makes it possible to reduce the number of components in the configuration, thereby reducing the scale of the device.

BRIEF DESCRIPTION OF THE DRAWINGS

FIG. 10b is a graph depicting a simplified version of the graph in 10a;

FIG. 13a is a top view of a vibrating plate arrangement tested in the above-mentioned test device; FIGS. 13b, 13c and 13d are different graphs depicting the relationships between sound pressure and position in test cases in which the frequency is altered;

FIG. 14a shows a case when the vibrators are touching one another; FIG. 14b shows a case when the vibrators are arranged at 2 mm intervals;

FIG. 17b is a graph depicting the relationship between particle removal rate and position in the case shown in FIG. 17a.

DESCRIPTION OF THE PREFERRED EMBODIMENTS

The preferred embodiments of the present invention will now be explained with reference to the diagrams. These embodiments refer to a case in which the invention is applied in a cleaning processing device for semiconductor wafers.

Figure 1:
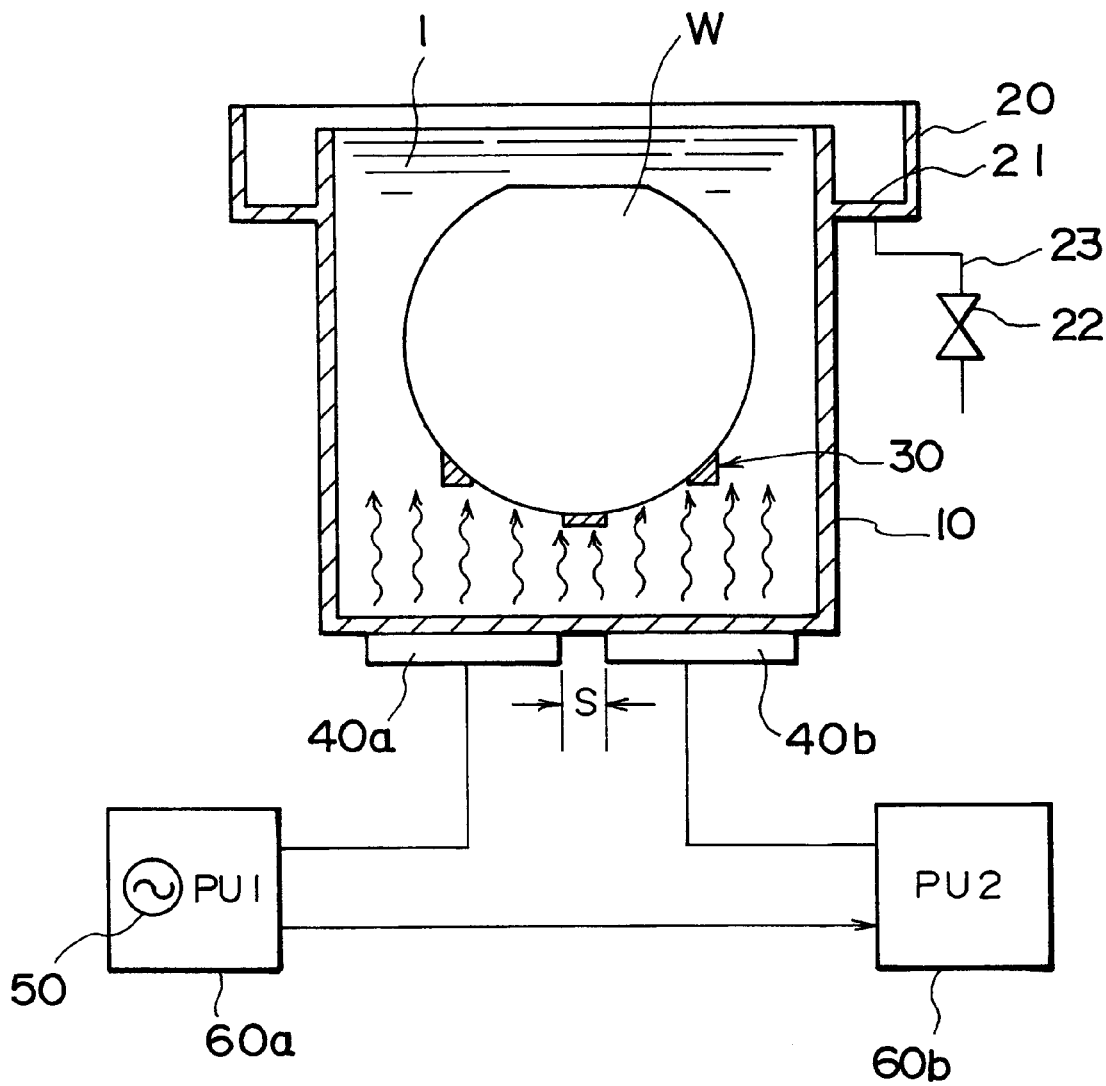
FIG. 1 is a schematic sectional view of an ultrasonic cleaning device in a first embodiment of the present invention.

FIG. 1 depicts a sectional view of a first embodiment of an ultrasonic cleaning device of the present invention. This ultrasonic cleaning device is provided with a cleaning tank 10 containing objects to be cleaned, in this case semiconductor wafers W (hereinafter wafers), and cleaning liquid, for instance pure water 1; an outer tank 20 for catching pure water 1 which has overflowed from cleaning tank 10; and means for holding wafers W within cleaning tank 10 such as, for instance, a wafer boat 30. Outer tank 20 has a waste water outlet 21 which is connected to a drainpipe 23 via a drain valve 22. In addition, supply means (not depicted in the figure) are provided to the bottom of cleaning tank 10 for supplying pure water 1 thereto.

Furthermore, a plurality of vibrating plates, for instance two vibrating plates 40a and 40b are affixed closely together, for instance at an interval S of 0.1~0.2 mm, to the bottom of cleaning tank 10 by means of an adhesive. In this case, vibrating plates 40a and 40b are formed from an electric distortion transducer, such as ceramic plating material (for instance, lead zirconate titanate [PZT] porcelain). Vibrating plate 40a is connected to a first oscillator 60a consisting of oscillation source 50 and power unit PU1, and vibrating plate 40b is connected to a second oscillator 60b which has a power unit PU2. Furthermore, the drive output phase of second oscillator 60b is controlled by the oscillation source 50 of first oscillator 60a. In other words, the configuration is such that uniform sound pressure distribution is obtained by matching the output phases of power units PU1 and PU2 which excite vibrating plates 40a and 40b.

Figure 3:
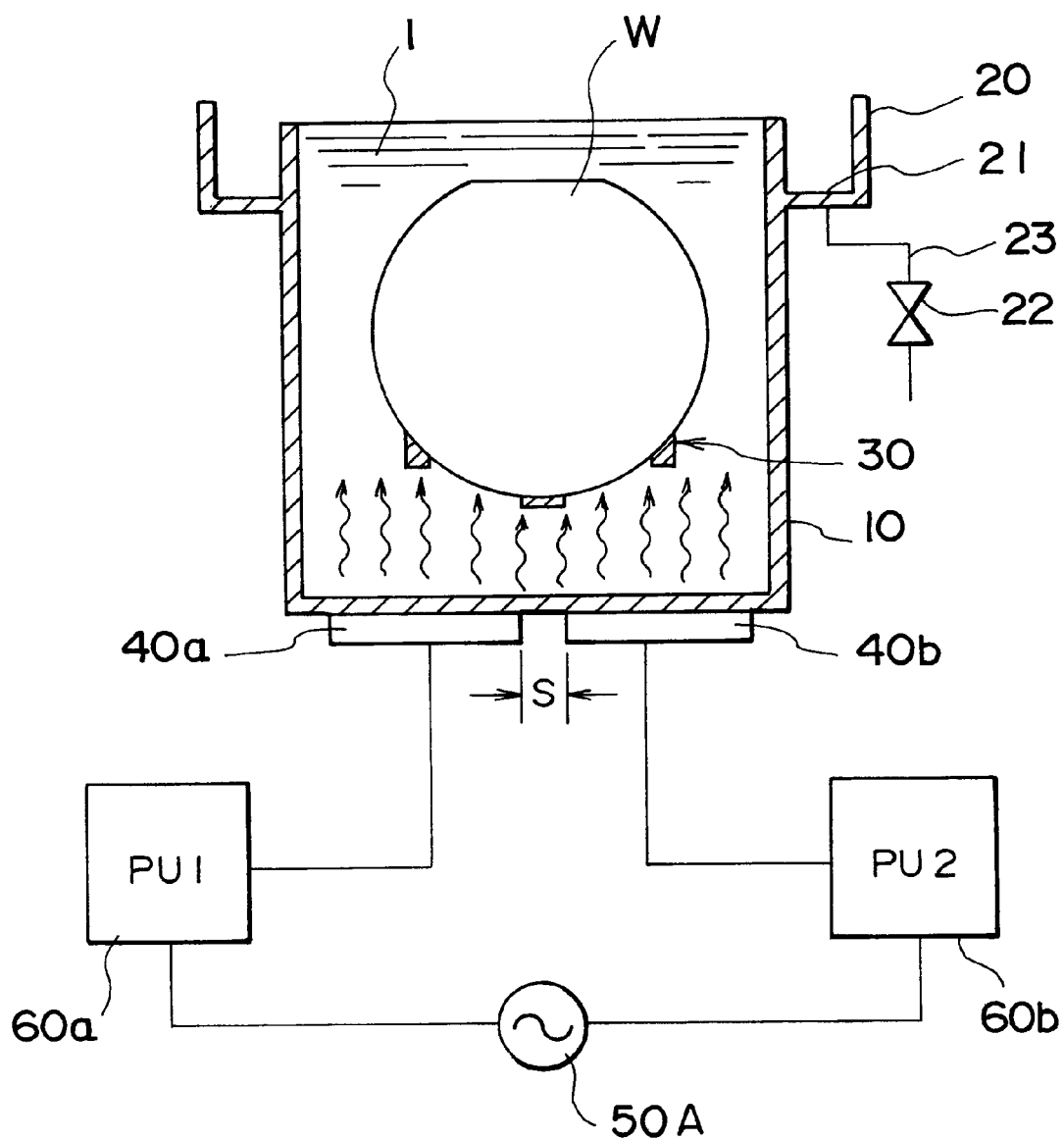
FIG. 3 is a schematic sectional view of an ultrasonic cleaning device in a second embodiment of the present invention.

In the present case, oscillation source 50 provided to first oscillator 60a controls the phase of second oscillator 60b, but the configuration is not restricted to this. As in the second embodiment depicted in FIG. 3, both first and second oscillators 60a and 60b may consist only of power units PU1 and PU2 and both oscillators may be phase-controlled with a single oscillation source 50a.

Figure 2A:
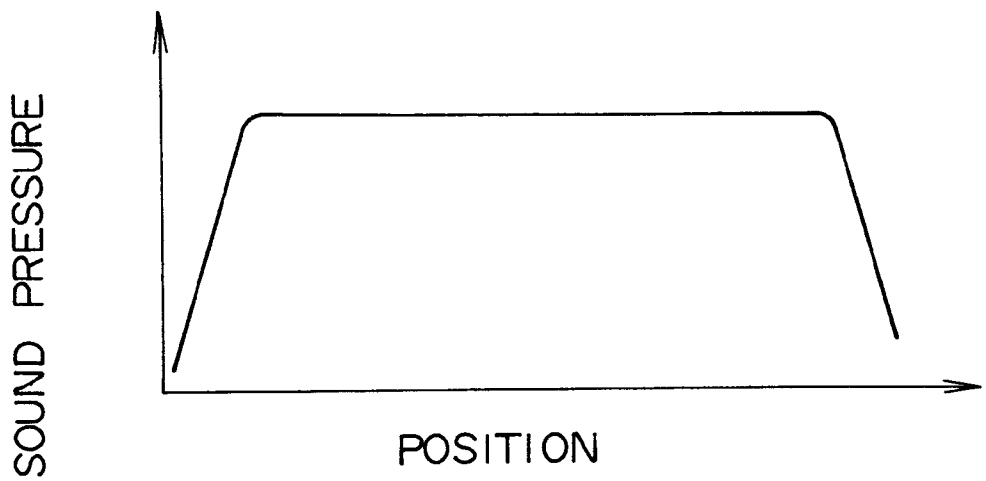
FIGS. 2a and 2b are graphs respectively depicting the relationship between sound pressure and position of a vibrating plate in the first embodiment and the relationship between the particle removal rate and position in the first embodiment.
Figure 2B:
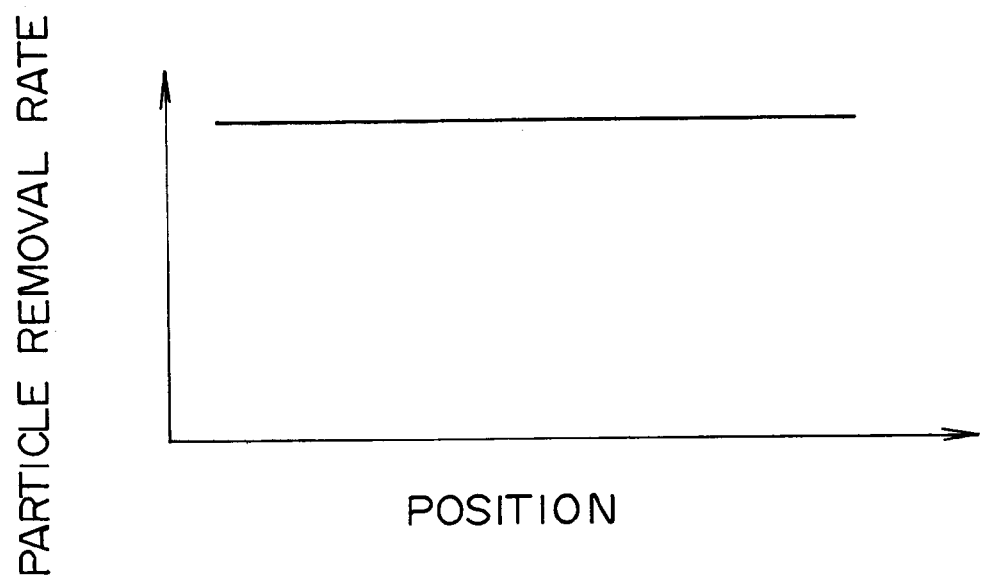

In the above configuration, since both vibrating plates 40a and 40b are driven in the same phase, vibrating plates 40a and 40b can be arranged with virtually no gap in between, or more precisely, with a gap S of only 0.1–0.2 mm. This eliminates nonuniformity resulting from ultrasonic interference, achieving a uniform distribution of sound pressure as shown in FIG. 2a and a uniform particle removal rate as shown in FIG. 2b.

Figure 4:
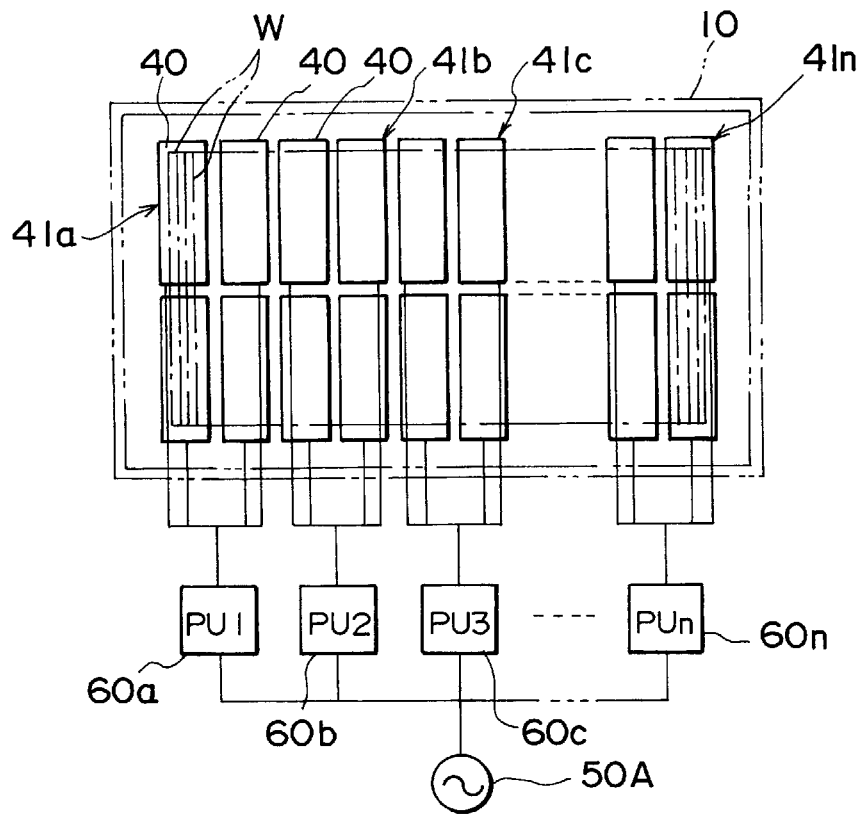
FIG. 4 is a top view of an ultrasonic cleaning device in a third embodiment of the present invention.
Figure 5:
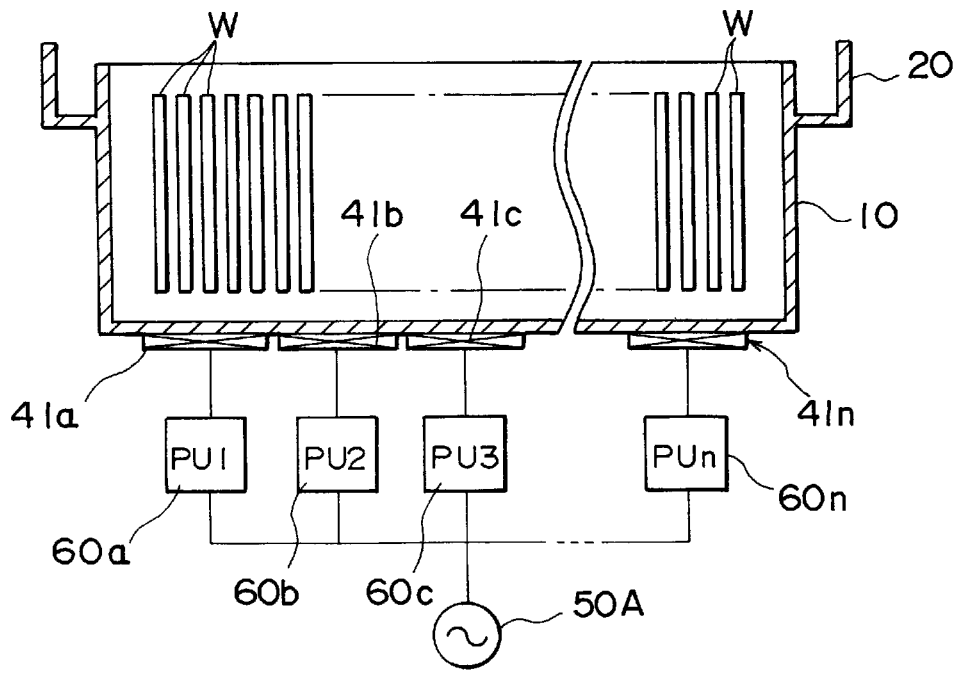
FIG. 5 is a sectional view of FIG. 4.

The above embodiments describe a case where two vibrating plates were provided, but the phase output of each vibrating plate can be similarly controlled by a single oscillation source when three or more vibrating plates are used. For instance, in a case where two rows of vibrating plates 40 are arranged at appropriate intervals on the bottom of cleaning tank 10 as in the third embodiment depicted in FIG. 4 and FIG. 5, four adjacent vibrating plates 40 (two plates from each row) can be deemed as a unit to create vibrating plate groups 41a, 41b, 41c ... 41n. These vibrating plate groups are respectively connected to first to nth oscillators 60a–60n which have power units PU1, PU2, PU3, ... PUn, all said oscillators 60a~60n being controlled by a single oscillation source 50A.

With the above configuration, the phases of the vibrating plates (specifically, vibrating plates 41a–41n) can be evenly regulated and uniform sound pressure distribution can be obtained. It is thus possible to efficiently remove particles and such like deposited on a plurality of wafers W, for example 50 wafers W contained at appropriate intervals in cleaning tank 10. Furthermore, since vibrating plates 40a and 40b can be installed to the bottom of cleaning tank 10 with no level difference between them, the device can be more easily assembled. Moreover, since multiple vibrating plates 40a and 40b are controlled by a single oscillation source 50A, the number of components in the configuration can be reduced and the overall scale of the device can be reduced.

Figure 6:
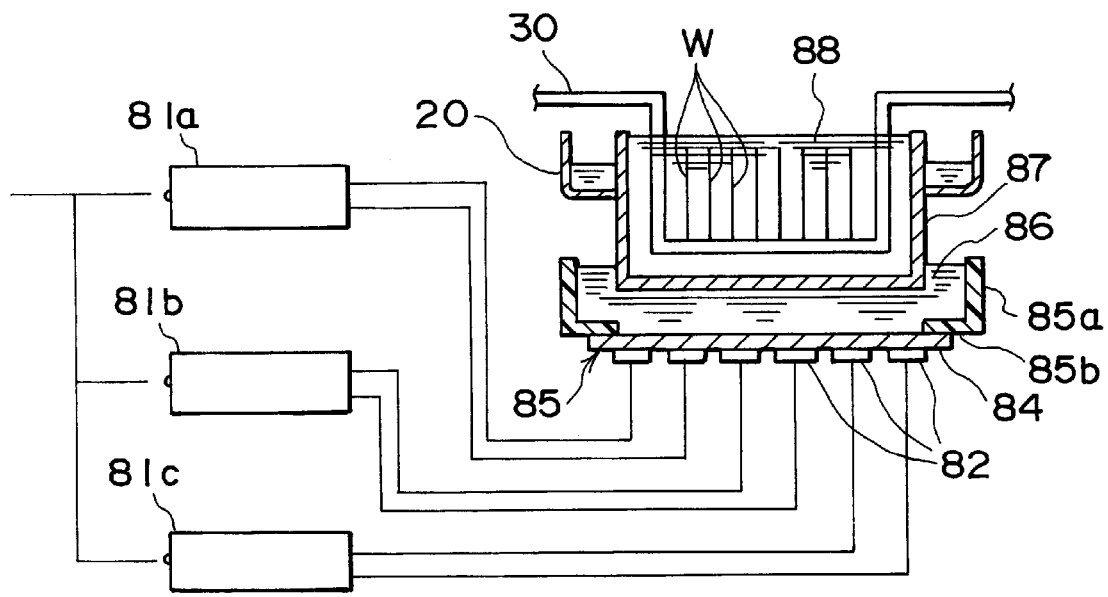
FIG. 6 is a schematic sectional view of an ultrasonic cleaning device in a fourth embodiment of the present invention.

FIG. 6 shows a fourth embodiment of the present invention. The ultrasonic cleaning device shown in FIG. 6 comprises a cleaning tank 87 formed from, for instance, quartz or such like which contains wafers W to be cleaned and cleaning liquid 88; an outer tank 20 connected to an opening in the top end of the cleaning tank 87 for catching cleaning liquid which overflows therefrom; and a vibration propagation tank 85 which contains holding means such as, for instance, a wafer boat 30 for holding wafers W within cleaning tank 87 and cleaning liquid for vibration propagation such as, for instance, water 86. The cleaning tank 87 is supported by a supporting element (not shown in the figure) in such a manner that the bottom of cleaning tank 87 is immersed in the water 86 in vibration propagation tank 85. Positioning the cleaning tank 87 in this way prevents damage to the cleaning tank 87 due to excessive ultrasonic vibration.

The vibration propagation tank 85 consists of a rectangular main body 85a formed from, for instance, PP (polypropylene) resin and a vibration transmission plate 84 formed from, for instance, stainless steel which is affixed to an inward-facing flange 85b provided on the lower portion of the main body 85a. This vibration transmission plate 84 is affixed either by bonding the plate 84 to the main body 85a with an adhesive, or by bolting the plate 84 to the main body 85 with packing (not shown in the figure) provided in between.

Figure 7:
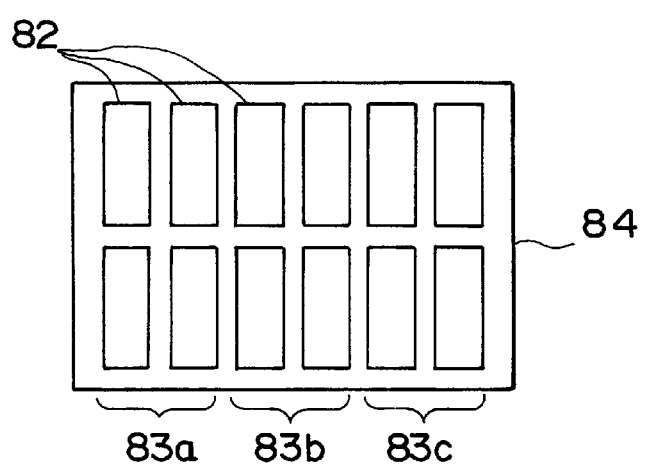
FIG. 7 is a bottom view of the vibrating plate portion of FIG. 6.

As in the first embodiment described above, vibrating plates 82 are affixed at appropriate intervals to the lower surface of vibration transmission plate 84 of vibration propagation tank 85 having the above-mentioned configuration using an adhesive or such like. In this case, the vibrating plates 82 are arranged in two rows with four plates constituting one group, so as to form vibrating plate groups 83a, 83b and 83c as shown in FIG. 7. Vibrating plate groups 83a, 83b and 83c are connected to power units 81a, 81b and 81c respectively. Here, vibrating plate group 83a is connected to power unit 81a and vibrating plate groups 83b and 83c are respectively connected to power units 81b and 81c.

Figure 8:
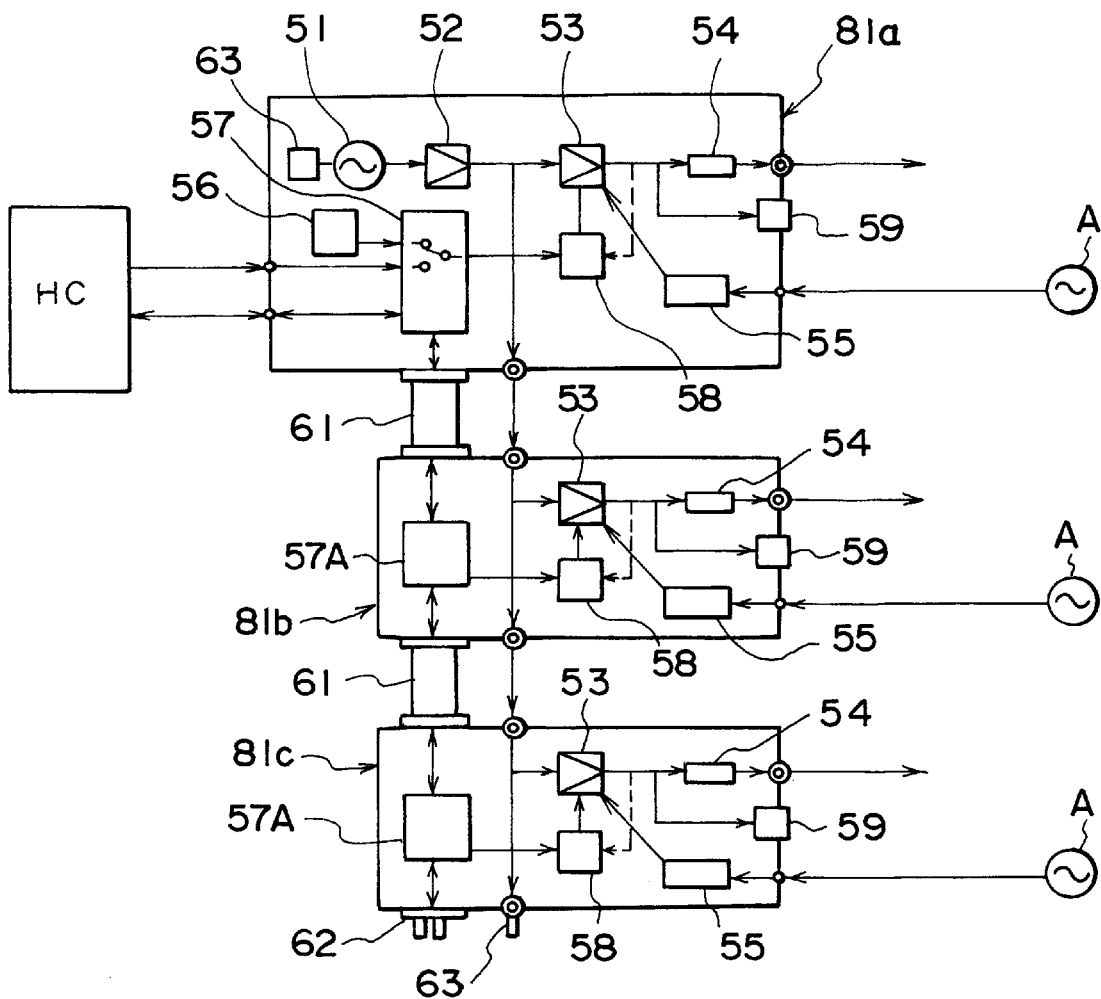
FIG. 8 is a block diagram depicting a circuit configuration of the power source in the fourth embodiment.

As FIG. 8 shows, the power unit 81a comprises an oscillation source provided by oscillator circuit 51 having a frequency-modulator (FM) 63, a first stage amplifier 52 for amplifying a vibration signal output from oscillator circuit 51, an electric amplifier 53 for further amplifying a vibration signal and a matching circuit 54 which performs matching in order to output a vibration signal amplified by electric amplifier 53 to the vibrating plate group 83a. Power unit 81a is further provided with an output adjustment circuit 58 for adjusting the output of electric amplifier 53, a control circuit 57 for sending a control signal to output adjustment circuit 58, an output adjustment rotary sum switch 56, a power source circuit 55 which is connected to power source A and an output meter 59 for monitoring output vibration signals.

The power units 81b and 81c comprise identical circuits to those forming power unit 81a. The output from the first-stage amplifier 52 of power unit 81a branches to an electric amplifier 53 in auxiliary power units 81b and 81c. Power units 81b and 81c each further comprise a matching circuit 54, an output adjusting circuit 58 for adjusting the output of electric amplifier 53, a control circuit 57A for controlling output adjustment circuit 58, a power source circuit 55 which is connected to power source A and an output meter 59 for monitoring output vibration signals. Furthermore, control circuit 57 of power unit 81a and control circuits 57A of power units 81b and 81c are connected via connectors 61. Outputs of each of the power units 81a, 81b and 81c are controlled by control signals sent from a host computer HC connected to control circuit 57 of power unit 81a. Symbol 62 in FIG. 8 denotes a short connector and 63 denotes a termination.

Figure 9A:
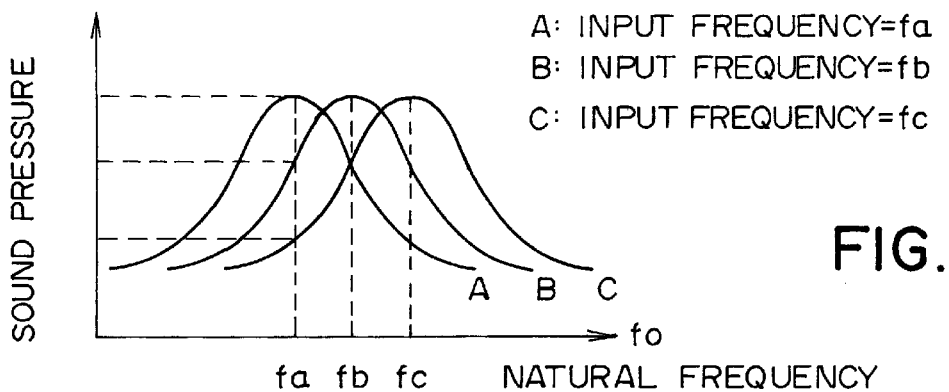
FIG. 9a is a graph depicting the relation between sound pressure and natural frequency when the oscillation source is not frequency-modulated.
Figure 9B:
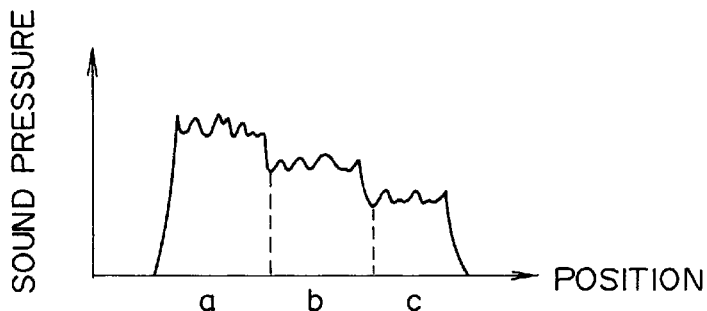
FIGS. 9b, 9c and 9d are graphs depicting relations between sound pressure and various vibrating plate positions.
Figure 9C:
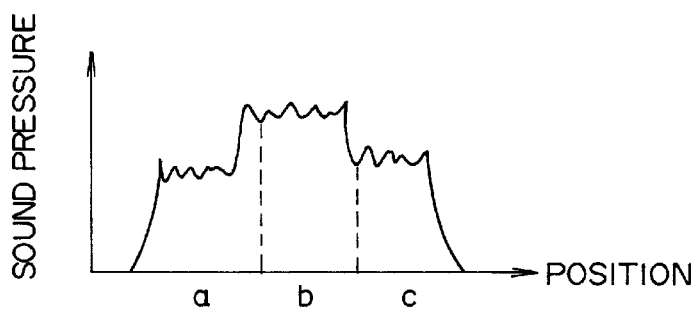
Figure 9D:
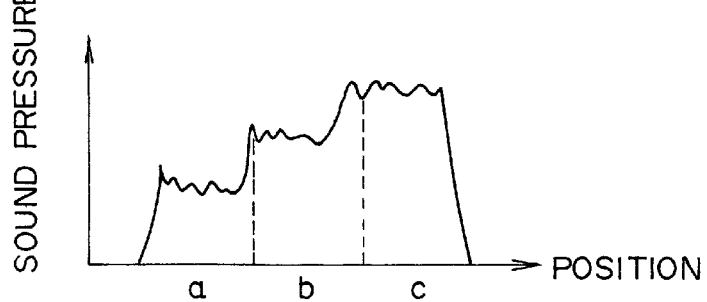
Figure 10A:
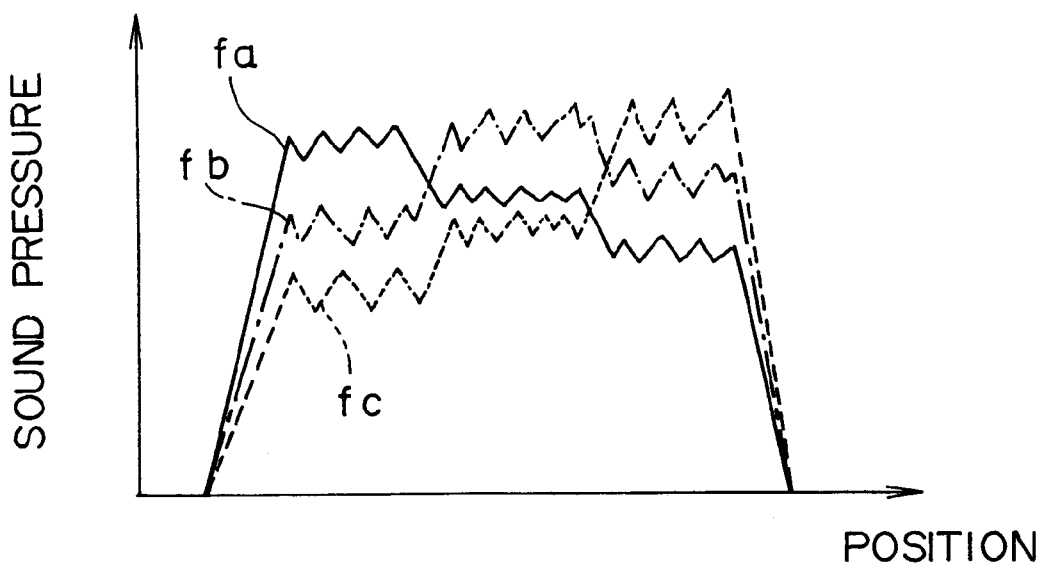
FIG. 10a is a graph depicting the relation between sound pressure and natural frequency when the oscillation source is frequency-modulated.
Figure 10B:
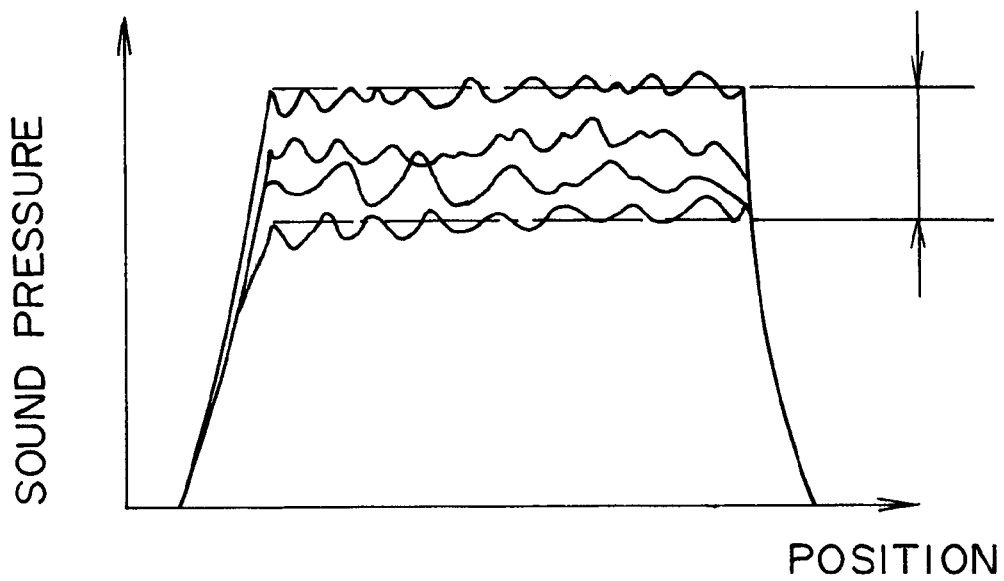

By affixing vibrating plate groups 83a, 83b and 83c to vibration transmission plate 84 on the bottom of a vibration propagation tank 85 configured as above and connecting a single frequency-modulated oscillation circuit 51 to vibrating plate groups 83a–83c, the average ultrasonic output of vibrating plates 82 can be kept within the difference range of the natural frequencies of multiple vibrating plates 82. As an example, let us suppose that vibrating plates A, B and C have natural frequencies fa, fb, and fc as shown in FIG. 9a. When oscillator circuit 51 applies an unmodulated fixed frequency to all the vibrating plates 82, differences in the natural frequencies of vibrating plate groups 83a–83c cause variations in sound pressure as shown in FIGS. 9b–9d. However, by for instance continuously modulating the frequency of the output of oscillator circuit 51 (i.e. frequency modulation) within the natural frequency difference range of the vibrating plates, sound pressure can be controlled so as to have a constant value when averaged over time as shown in FIG. 10a and FIG. 10b.

Vibration from vibrating plates 82 in vibrating plate groups 83a–83c with sound pressure controlled to a constant as described above is transmitted by vibration transmission plate 84 to the water 86. The vibration is then propagated through the water 86 to the bottom of cleaning tank 87 and to the cleaning liquid 88 contained therein, thereby cleaning the wafer W in cleaning tank 87. Therefore, since ultrasonic intensity can be controlled to a constant when averaged over time by continually carrying out frequency modulation within the variation range of the natural frequencies of vibrating plates 82, the particle removal rate can be increased further.

In the fourth embodiment, a case was described in which wafers were ultrasonically cleaned through a cleaning tank 87 for vibration propagation, but vibrating plates 82 may acceptably be affixed to the bottom of cleaning tank 87 as in the first to third embodiments. Similarly, in the first to third embodiments, wafers can be ultrasonically cleaned through cleaning tank 87 as in the fourth embodiment.

Figure 11:
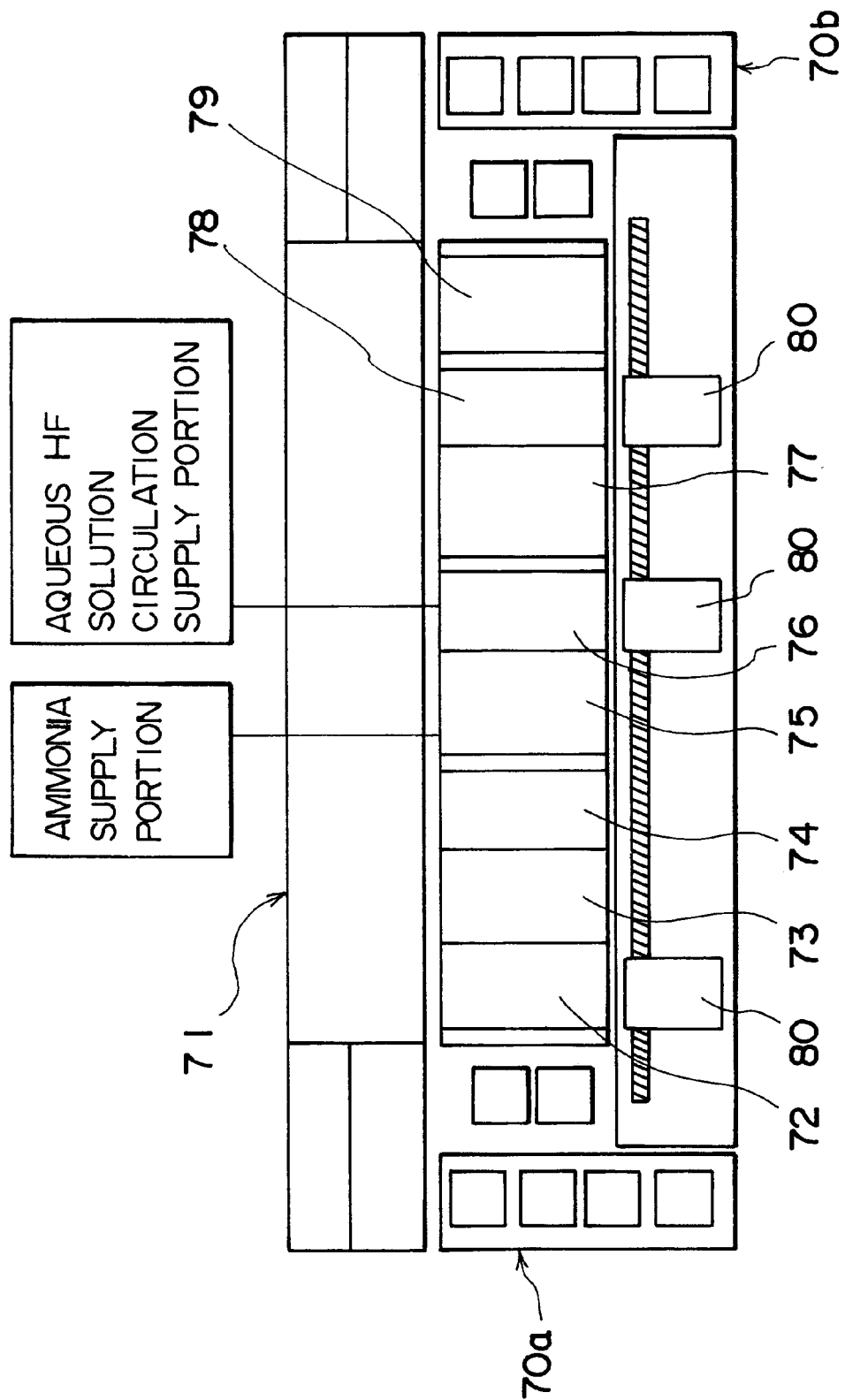
FIG. 11 is a top view of an example of a cleaning/drying system in which an ultrasonic cleaning device of the present invention has been applied.

An ultrasonic cleaning device having the configuration described above can be used singly to perform cleaning processing, or it can be incorporated in a wafer cleaning/drying system, an example of which is shown in FIG. 11. The main section of this wafer cleaning/drying system comprises a carrying portion 70a which contains unprocessed wafers W, a cleaning/drying processing unit 71 for cleaning and drying wafers W, a carrying portion 70b for containing wafers W after it has been cleaned and dried, and a plurality of (for instance, 3) wafer chucks 80 arranged on one side of cleaning/drying unit 71 for conveying out a predetermined number of (for instance, 50) wafers W.

First chuck cleaning/drying unit 72, first treating liquid processing unit 73, first rinsing unit 74, second treating liquid (for instance, ammonia) processing unit 75, third treating liquid (for instance, hydrofluoric acid [aqueous HF]) processing unit 76 which form the liquid processing device, rinsing unit 77 using the ultrasonic cleaning device of the present invention, second chuck cleaning/drying unit 78 and drying unit 79 are provided to cleaning/drying unit 71 sequentially in a straight line from carrying portion 70a to carrying portion 70b. The ultrasonic cleaning device of the present invention can also be used in first treating liquid processing unit 73.

In the cleaning/drying system with the above configuration, wafer chucks 80 convey the unprocessed wafers W sequentially through each of the processing units 73, 74, 75, 76 and 77 of the cleaning/drying unit 71. After predetermined treating liquid and cleaning processes have been performed, the wafer chucks convey wafers W to drying unit 79 to be dried.

In the above description of this embodiment, the ultrasonic cleaning device of the present invention was applied in a semiconductor wafer cleaning device, but the ultrasonic cleaning device of the present invention can of course be applied in cleaning processing of objects other than semiconductor wafers, such as an LCD glass plate.

EXAMPLES

Next, tests will be explained in which the reduction in sound pressure around the border of a vibrating plate in the ultrasonic cleaning device of the present invention was compared with that around the border of a vibrating plate in a conventional ultrasonic cleaning device.

Figure 12:
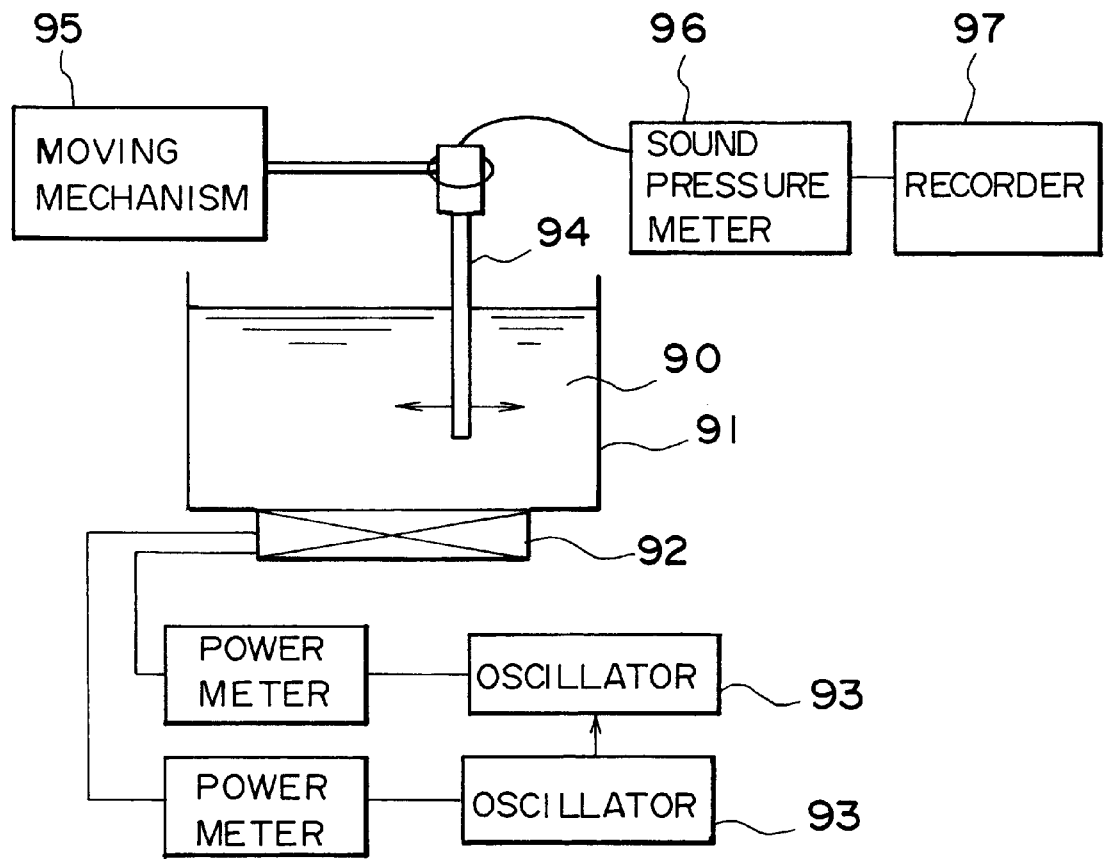
FIG. 12 shows a diagrammatic configuration of a test device for measuring sound pressure of a vibrating plate.

To perform these tests, a test device as shown in FIG. 12 was prepared and sound pressure was measured under the conditions described below. A vibrator 92 (vibrating plate) driven by two oscillators 93 is provided to the bottom of a stainless steel tank 91 containing water 90. A sound pressure sensor 94 inserted into the water 90 in tank 91 is moved horizontally by moving mechanism 95. Sound pressure signals detected by sound pressure sensor 94 are measured by sound pressure meter 96 and recorded in recorder 97.

Measurement Method
1) measure sound pressure distribution on vibrator surface
2) measure 77 points on vibrator surface
3) sound pressure sensor 94 performs fixed-speed scanning of the vibrator top and the signals from sound pressure sensor 94 are recorded in recorder 97.

Measurement Conditions
1) fluid temperature: 50° C. (still water)
2) fluid depth: 220 mm
3) measurement point: 150 mm from vibrator surface
4) ultrasonic strength: 2.7 W/cm2
5) sensor pickup diameter: 7 mm
6) sensor scanning speed: 2.7 mm/sec
7) recorder paper speed: 1.3 mm/sec With the above measurement methods and conditions, two vibrators 92 and 92 having a length of 107.5 mm were positioned with a gap of 1 mm between them as shown in FIG. 13 and sound pressure sensor 94 scanned from point A to point B.

(1) FIG. 13b shows measurements obtained when the two vibrators 92 were excited in synchrony at the same frequency (f=985 KHz).

(2) FIG. 13c shows measurements obtained when the two vibrators 92 were excited at different frequencies (f1= 983 KHz, f2=982 KHz)

(3) FIG. 13d shows measurements obtained when the two vibrators 92 were excited at the same frequency (f3= 983 KHz) in reverse-phase.

The results of the above tests revealed that, when the vibrators 92 were excited at different frequencies (case (2) above) and at the same frequency in reverse-phase (case (3) above), sound pressure in the space between the two vibrators 92 decreased by approximately 0.6–0.7 V in both cases. By contrast, when the vibrators 92 were excited in synchrony (case (1) above), the reduction in sound pressure between the two vibrators 92 was approximately 0.2 V.

Figure 14A:
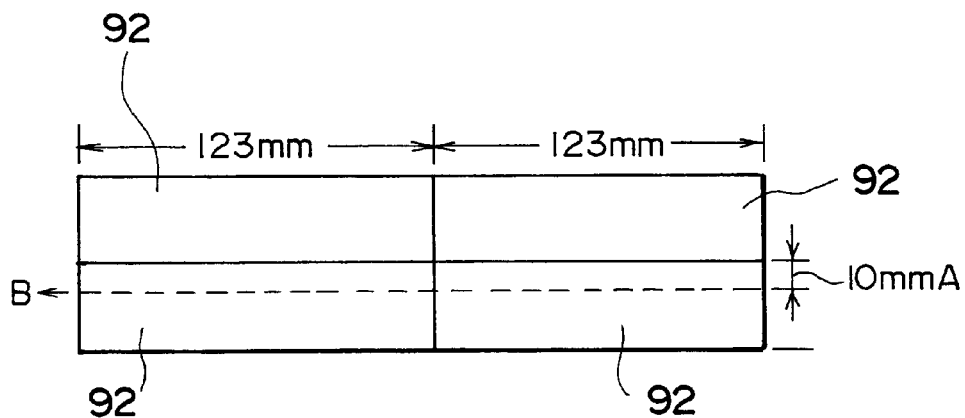
FIG. 14a and FIG. 14b are top views of another vibrating plate arrangement tested in the above-mentioned test device.
Figure 15A:
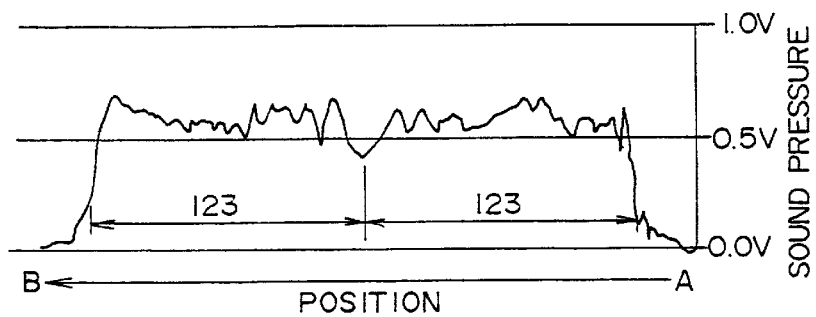
FIG. 15a and FIG. 15b are graphs depicting the relationships between sound pressure and position when the vibrating plates are excited with the same frequency in the states shown in FIG. 14a and FIG. 14b.

(4) Four vibrators 92 having a length of 123 mm were disposed in absolute contact as shown in FIG. 14a and sound pressure sensor 94 scanned from point A to point B. FIG. 15a shows the result obtained when these vibrators 92 were excited in synchrony (f4=984 KHz).

Figure 14B:
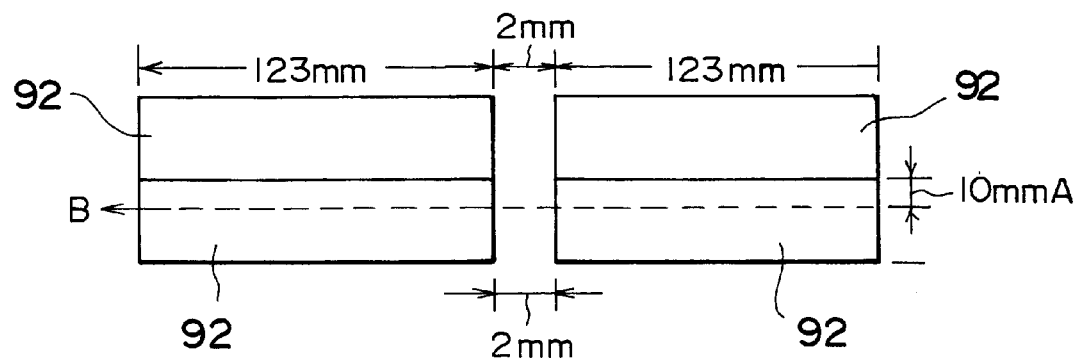
Figure 15B:
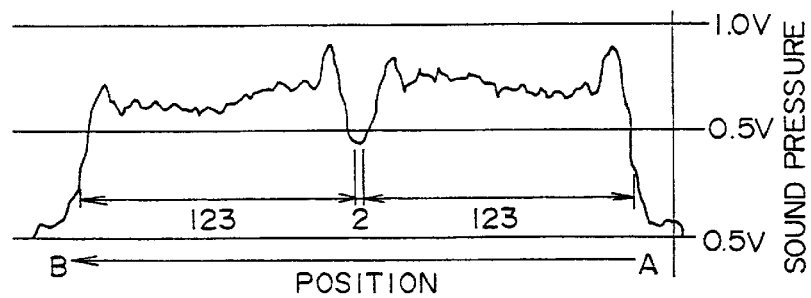

(5) Four vibrators 92 having a length of 123 mm were disposed in two pairs of two vibrators 92 with a interval of 2 mm between their short ends as shown in FIG. 14b and sound pressure sensor 94 scanned from point A to point B. FIG. 15b shows the result obtained when the vibrators 92 were excited in synchrony (f5=983 KHz).

Figure 15C:
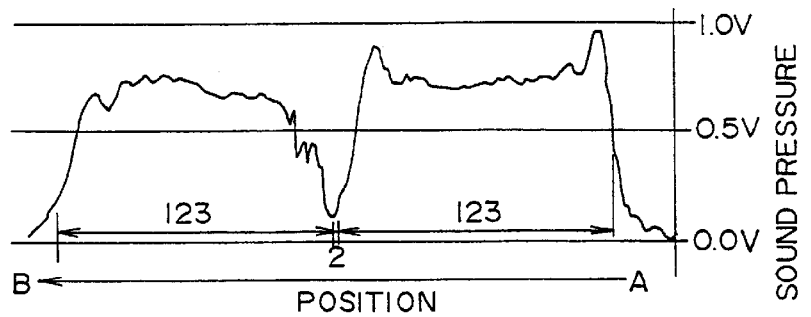
FIG. 15c is a graph depicting the relationship between sound pressure and position when the vibrating plates are excited with another frequency in the state in FIG. 14b.
Figure 16:
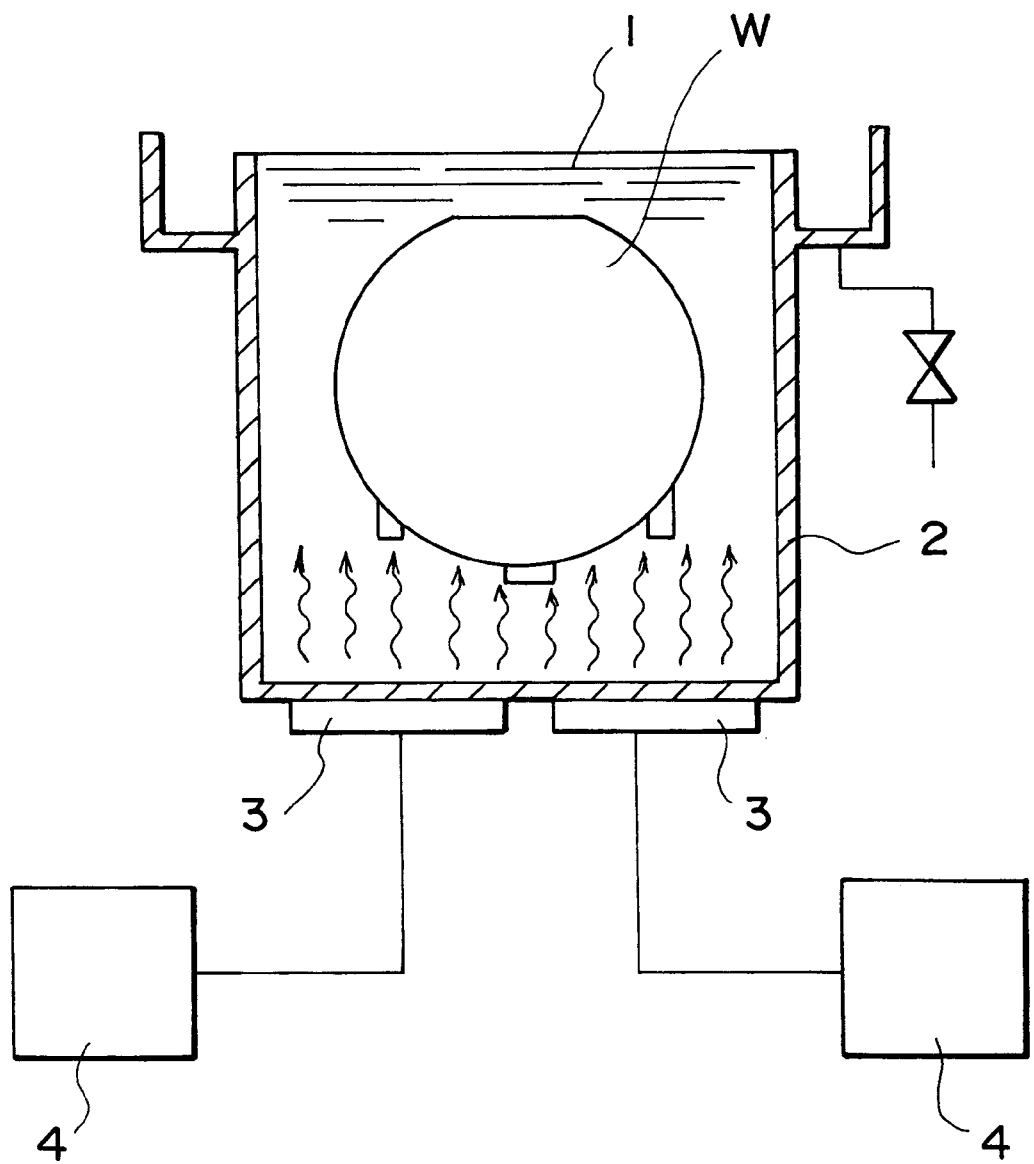
FIG. 16 is a sectional view of a conventional ultrasonic cleaning device.
Figure 17A:
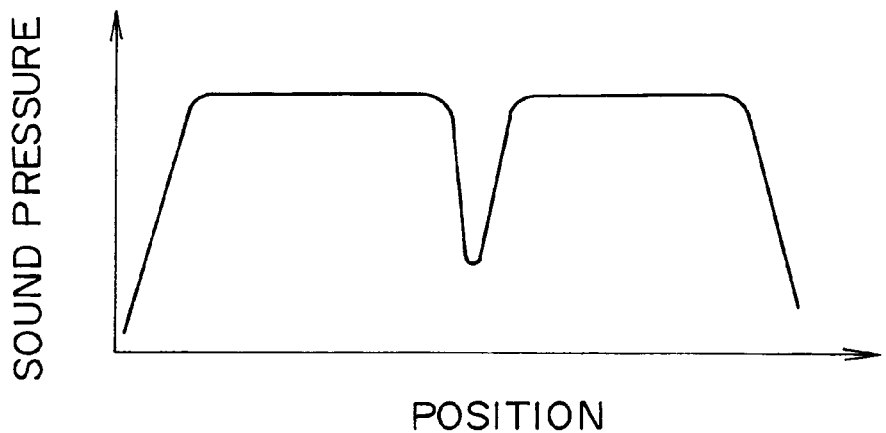
FIG. 17a is a graph depicting the relationship between sound pressure and position of vibrating plates in a conventional ultrasonic cleaning device.
Figure 17B:
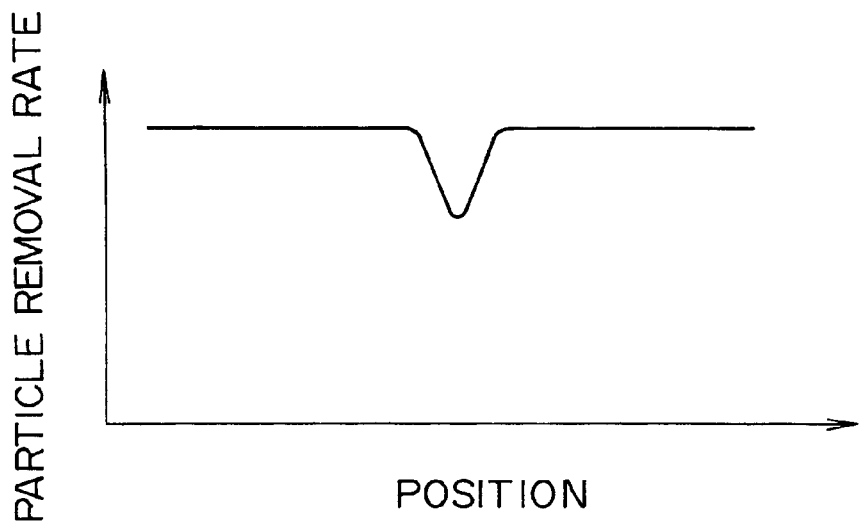

(6) Furthermore, four vibrators 92 having a length of 123 mm were disposed in two pairs of two vibrators 92 with an interval of 2 mm between their short ends as in case (5) and sound pressure sensor 94 scanned from point A to point B, but in this case the two pairs of vibrators 92 were excited at different frequencies (f6=983 KHz, f7=984 KHz). FIG. 15c shows the result obtained.

The results of the above tests revealed that, when the vibrators 92 were disposed with a gap of 2 mm therebetween and excited in synchrony (case (5) above), the reduction in sound pressure between the vibrators 92 was approximately 0.5 V. When the vibrators 92 were disposed with a gap of 2 mm therebetween and excited with different frequencies (case (6) above), the reduction in sound pressure between the vibrators 92 was approximately 0.75 V. By contrast, when the four vibrators 92 were disposed in absolute contact and excited in synchrony (case (4) above), the reduction in sound pressure was 0.15 V. Therefore, the gap between the vibrators 92 should preferably be as small as possible.

Since the present invention has the configuration described above, the following excellent effects can be obtained.

Uniform sound pressure distribution and a uniform particle removal rate can be obtained by controlling the output phase of the oscillator of each vibrating plate with a single oscillation source. Moreover, cleaning inconsistencies are eliminated, thereby improving cleaning efficiency. Furthermore, assembly of the device can be simplified, since vibrating plates can be provided to the cleaning tank without level difference, and since multiple vibrating plates are controlled by a single oscillation source, the number of elements required in the configuration and the scale of the device itself can be reduced.

With the above-mentioned configuration, gaps between adjacent vibrating plates can be reduced as much as possible, and sound pressure distribution and particle removal rate can be rendered uniform. Therefore, cleaning inconsistencies can be even more reliably eliminated, improving the cleaning efficiency and reliability of the device.

Furthermore, when frequency is modulated at the oscillation source, it is possible to control the ultrasound output of the vibrating plates so as to have an average value within the range of variation in the natural frequencies between the vibrating plates, thereby obtaining even more uniform sound pressure distribution and particle removal rate.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. An ultrasonic cleaning device comprising:
    a cleaning tank for containing an object to be cleaned and a cleaning liquid;
    a plurality of vibrating plates for acting upon the cleaning tank;
    a plurality of power units for applying high frequency voltages to the vibrating plates; and
    a single oscillation source for controlling the high frequency voltages applied by the plurality of power units to have a same phase whereby the vibrating plates are driven at said same phase.

2. An ultrasonic cleaning device according to claim 1, wherein:
    the single oscillation source is included in one of the power units and the single oscillation source has one oscillator.

3. An ultrasonic cleaning device according to claim 1, wherein:
    the single oscillation source is provided independently from the plurality of power units.

4. An ultrasonic cleaning device according to claim 1, wherein:
    the vibrating plates are split into a plurality of groups with a power unit provided to each group.

5. An ultrasonic cleaning device according to claim 1, further comprising:

a vibration propagation tank for containing the cleaning tank in vibration propagation fluid, the vibrating plates being provided to said vibration propagation tank.

6. An ultrasonic cleaning device according to claim 1, wherein:

the vibrating plates are disposed without substantial gaps therebetween.

7. An ultrasonic cleaning device according to claim 1, wherein:

the oscillation source further comprises a frequency modulator.

8. An ultrasonic cleaning device according to claim 7, wherein:

the frequency modulator performs modulation so as to make ultrasonic outputs of the vibrating plates uniform within a range of difference of natural frequencies of the vibrating plates.

* * * * *